United States Patent
Raad

(10) Patent No.: US 7,464,231 B2
(45) Date of Patent: Dec. 9, 2008

(54) METHOD FOR SELF-TIMED DATA ORDERING FOR MULTI-DATA RATE MEMORIES

(75) Inventor: George B. Raad, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 11/519,698

(22) Filed: Sep. 11, 2006

(65) Prior Publication Data

US 2007/0016748 A1  Jan. 18, 2007

Related U.S. Application Data

(63) Continuation of application No. 10/652,160, filed on Aug. 29, 2003.

(51) Int. Cl.
*G06F 12/00* (2006.01)
*G11C 8/18* (2006.01)

(52) U.S. Cl. ............... 711/158; 711/105; 365/230.04; 365/230.08; 365/233.13

(58) Field of Classification Search ............... None
See application file for complete search history.

(56) References Cited

U.S. PATENT DOCUMENTS

| | | | | |
|---|---|---|---|---|
| 6,061,292 A | | 5/2000 | Su et al. ................ 365/230.06 |
| 6,097,640 A | | 8/2000 | Fei et al. ................ 365/89.02 |
| 6,130,853 A | * | 10/2000 | Wang et al. ............. 365/230.06 |
| 6,154,419 A | | 11/2000 | Shakkarwar ............. 365/235 |
| 6,166,970 A | | 12/2000 | Yun ........................ 365/191 |
| 6,201,760 B1 | | 3/2001 | Yun et al. ................ 365/233 |
| 6,252,812 B1 | | 6/2001 | Maeda .................... 365/201 |
| 6,279,073 B1 | | 8/2001 | McCracken et al. ...... 711/105 |
| 6,282,132 B1 | | 8/2001 | Brown et al. |
| 6,407,963 B1 | | 6/2002 | Sonoda et al. .......... 365/233.5 |
| 6,415,374 B1 | * | 7/2002 | Faue et al. .............. 711/173 |
| 6,427,196 B1 | * | 7/2002 | Adiletta et al. .......... 711/158 |
| 6,442,102 B1 | | 8/2002 | Borkenhagen et al. .... 365/235 |
| 6,445,642 B2 | | 9/2002 | Murakami ................ 365/233 |
| 6,452,867 B1 | | 9/2002 | Ryan ....................... 365/233 |
| 6,477,107 B1 | | 11/2002 | Lee ......................... 365/233 |
| 2001/0039602 A1 | * | 11/2001 | Kanda et al. ............. 711/105 |

(Continued)

FOREIGN PATENT DOCUMENTS

WO      WO 00/51132      8/2000

(Continued)

*Primary Examiner*—Denise Tran
(74) *Attorney, Agent, or Firm*—TraskBritt

(57) ABSTRACT

A self-timed data ordering method and circuit for multi-data rate memories orders a plurality of data words substantially simultaneously retrieved during successive read operations of a memory device. A data word ordering designator is stored from each of the successive read operations and managed in a first-in first-out manner. The data word ordering designator configures ordering circuitry for the desired ordering of the plurality of data words simultaneously retrieved. Following the ordering of the plurality of data words, the properly ordered data words are latched in their desired order for subsequent delivery. Once the properly ordered data words are latched, the ordering circuitry is reconfigured according to the next oldest data word ordering designator. The data word ordering designator retains the pipelined ordering of the corresponding read operations to the corresponding memory banks of the memory device.

16 Claims, 7 Drawing Sheets

U.S. PATENT DOCUMENTS

| | | | |
|---|---|---|---|
| 2001/0054135 A1 | 12/2001 | Matsuda | 711/167 |
| 2002/0012285 A1 | 1/2002 | Noda et al. | 365/233 |
| 2002/0131319 A1 | 9/2002 | Martin | 365/233 |
| 2002/0147898 A1 | 10/2002 | Rentschler et al. | 711/170 |
| 2002/0149967 A1 | 10/2002 | Borkenhagen et al. | 365/189.05 |
| 2002/0173926 A1 | 11/2002 | McCord | 702/120 |

FOREIGN PATENT DOCUMENTS

| | | |
|---|---|---|
| WO | WO 01/24184 | 4/2001 |

* cited by examiner

METHOD FOR SELF-TIMED DATA ORDERING FOR MULTI-DATA RATE MEMORIES

CROSS-REFERENCE TO RELATED APPLICATION

This application is a continuation of application Ser. No. 10/652,160, filed Aug. 29, 2003, pending.

BACKGROUND OF THE INVENTION

1. Field of the Invention

The present invention relates generally to multi-data rate memories, such as double-data rate (DDR) memories and, more particularly, to the ordering of multiple data retrieved during a dual or multi-data rate read operation.

2. State of the Art

Data intensive applications for computers, such as personal computers, are becoming increasingly more popular. Such data intensive applications include graphics-intensive applications, including real-time imaging, games, animation and others. As these applications become more complex, they require hardware platforms (e.g., computers) on which they execute to improve in performance and capability. In an attempt to accommodate such data-intensive applications, microprocessors within computers have become increasingly faster in their performance. However, microprocessors require accessible data from memory upon which to operate and present for such applications.

One approach for making data more readily available to a microprocessor has been the development of multi-data rate memory, namely a double-data rate (DDR) memory. DDR memory is named from is functional characteristic of using the rising and falling edge of the memory bus clock for timing. Whereas traditional memory modules use only the rising edge of the clock for timing, DDR memory can effectively double the data rate of data that is available to a microprocessor by making a first retrieved word of data available on the rising edge of the memory bus clock and a second retrieved word of data available on the falling edge of the memory bus clock. Such an implementation improves the overall bandwidth of a memory as seen by the microprocessor.

A DDR memory typically operates by simultaneously retrieving two words of data, each word of n-bits in length with one word from an even memory cell bank and the other word from an odd memory cell bank, with both words from the same location within the memory as addressed by the logical circuitry. While two separate words are retrieved in parallel, they are ordered for individual sequential outputting to the microprocessor. The ordering of the two separate words is also unique to various programming applications. For example, one application programming technique may be configured to perform an incrementing access of sequentially stored data elements with incrementing data stored first in the even memory location followed by the next data being stored in the odd memory location. Conversely, another programming technique may perform a different process on data by retrieving the data from the DDR memory and requesting the output ordering of the retrieved words of data to begin with odd memory location or requesting the odd bank data word being output first followed by the even memory location or even bank data word. Maintaining the desired ordering of the present words is crucial for accurate data manipulation and presentation.

Another approach for improving the bandwidth of memories includes pipelining of memory read operations. Reading of data from a memory device typically requires more than a single processor clock cycle in order to (i) address the specific memory location, (ii) sense the data at that location and (iii) output the sensed data. This delay is typically referred to as "read latency." Specifically, read latency is the delay, in clock cycles, between the registration of a read command and the availability of the first bit of output data. In order to improve the bandwidth of memory devices, one or more subsequent read commands can be issued before the end of a previous read operation's latency period.

The issuance of overlapping read operations in a single data rate memory results in consecutive outputting of each of the individually retrieved words. However, in a multi-data rate memory, such as a DDR memory, where multiple overlapping read operations each yield multiple words of data, tracking the ordering of the outputting of the data word pairs with the corresponding read operation becomes problematic. Additionally, since each read operation in DDR memory specifies a specific ordering of the retrieved words when output to the microprocessor, data errors may occur if the read operation specifics (i.e., ordering of word pairs) do not remain matched with the outputting process from the memory.

There is a need, therefore, for reliably ordering data retrieved from a multi-data rate read operation as specified in the initial read command. For these and other reasons, there is a need for the present invention.

BRIEF SUMMARY OF THE INVENTION

A self-timed data ordering method and circuit for multi-data rate memories are provided. In one embodiment of the present invention, a method is provided for ordering a plurality of data words substantially simultaneously retrieved during successive read operations of a memory device. In response to a read operation, a data word ordering designator is stored from each of the successive read operations. When multiple data word ordering designators are present, they are stored and managed in a first-in first-out manner. The data word ordering designator configures ordering circuitry for the desired ordering of the plurality of data words simultaneously retrieved. Following the ordering of the plurality of data words, the properly ordered data words are latched in their desired order for subsequent delivery. Once the properly ordered data words are latched, the ordering circuitry is reconfigured according to the next data word ordering designator. The data word ordering designator retains the pipelined ordering of the corresponding read operations to the corresponding memory banks of the memory device.

In another embodiment, a data ordering circuit for ordering multiple data words retrieved during a simultaneous read of multiple memory banks is provided. The data ordering circuit includes a data word ordering designator register configured to store, in a first-in first-out order, a data word ordering designator from each of the successive read operations designating a simultaneous read of a plurality of data words. The data ordering circuit also generates a signal for controlling ordering circuitry capable of desirably ordering the simultaneously retrieved multiple data words. The circuit further includes registers for storing the ordered data words until they are individually retrieved.

In yet another embodiment, a memory device including a plurality of memory banks configured for simultaneous reading of a plurality of data words is provided. The memory device includes the data ordering circuit configured to desirably order the plurality of words for outputting on various clock phases. A specific embodiment of a DDR memory is also provided. In operation, the DDR memory device receives successive read commands and stores the corresponding data word ordering designator for each. The corresponding data word designator configures the ordering logic in a manner that enables the resulting multiple data words to be ordered as requested for outputting on corresponding rising and falling clock edges.

BRIEF DESCRIPTION OF THE SEVERAL VIEWS OF THE DRAWINGS

The foregoing and other advantages of the invention will become apparent upon reading the following detailed description and upon reference to the drawings in which.

DETAILED DESCRIPTION OF THE INVENTION

Figure 1:
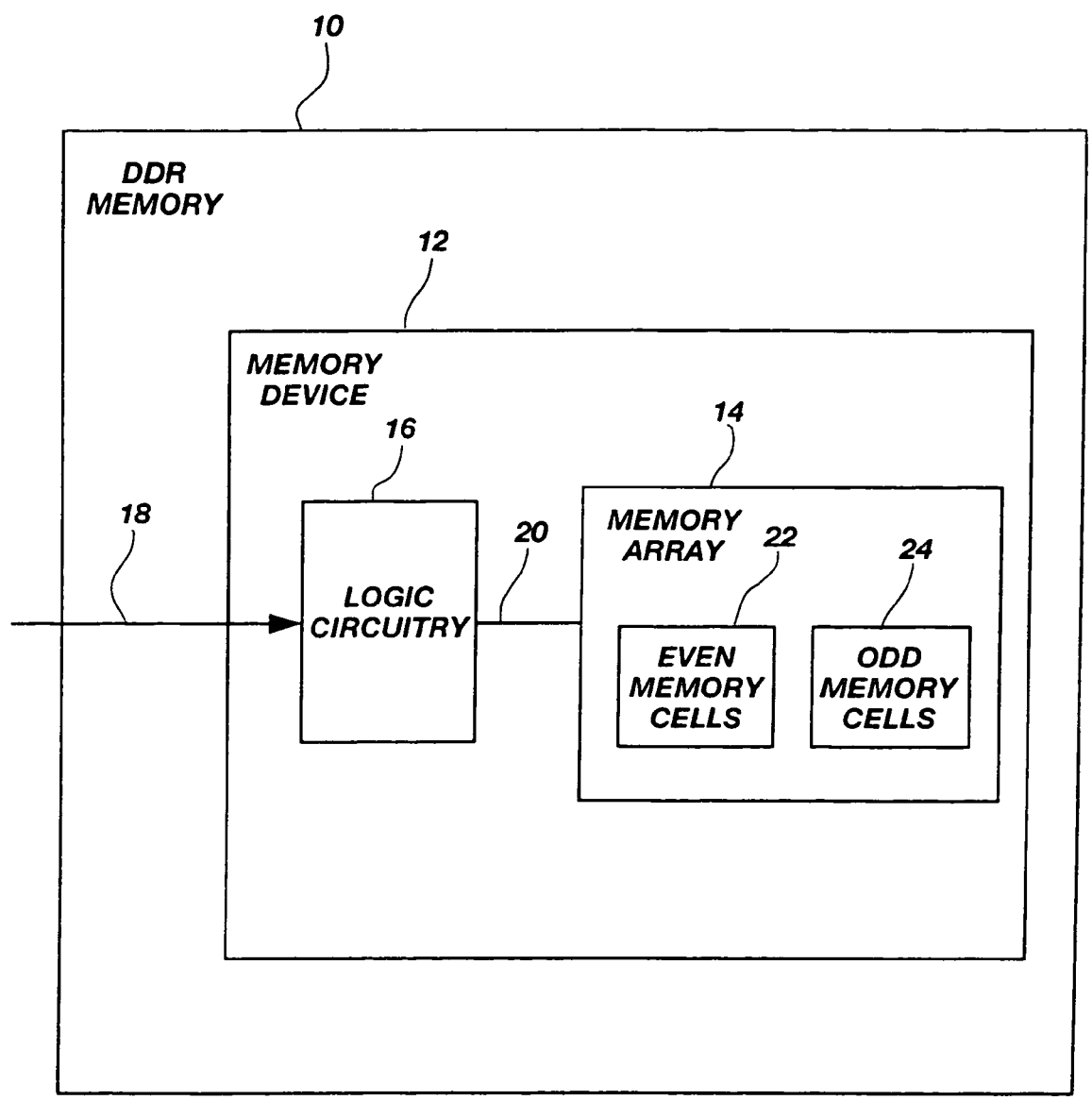
FIG. 1 is a block diagram of a multi-data rate memory, in accordance with one embodiment of the present invention.

One exemplary embodiment of the present invention provides for a multi-rate memory, such as a DDR memory, having a self-timed data ordering mechanism in response to read operations yielding multiple data words. Referring to FIG. 1, a block diagram of a DDR memory, according to an exemplary embodiment of the present invention is shown. DDR memory 10 includes a memory device 12 which further includes a memory array 14, logic circuitry 16, interface lines 18 for providing an external interface with other systems, such as a microprocessor, and address and control lines 20 for electrically operably coupling the logic circuitry 16 with the memory array 14.

The memory array 14 includes memory cells 22, 24 addressable by even and odd word addresses with the memory cells being accessed in response to address signals provided on address lines which form a portion of interface lines 18. Logic circuitry 16 includes input/output buffers, control circuitry, address decoders, (all not shown) and, particular to the present invention, data ordering logic 56 (FIG. 4) for tracking the specified ordering of the multiple data words retrieved from memory array 14. Interface lines 18 and lines 20 may also include control signals including, but not limited to, a clock (CLK), a Row Access Strobe (RAS), a Column Access Strobe (CAS), a Write Enable (WE), and a Clock Enable (CKE), (all not shown).

Each addressable memory location in array 14 contains 2n-bit words with each addressable memory location having a unique address as a result of the combination of a bank address, a row address, and a column address. For a given read operation, data words are separated into two, n-bit data words. Each of the n-bit words are transferred, one at a time, to data I/O (DQ) terminals (FIG. 3B) of the device. The order of the transfer is determined by a data word ordering designator such as an address bit, one of which is commonly referred to as the column address zero (CAØ). By way of example, and not limitation, the specific word of the n-bit word pair selected by a zero logic level on CAØ is considered the even word (i.e., any address with CAØ=0 is considered an even word address). Alternatively, the word selected by a 1 logical level on CAØ is considered the odd word (i.e., an address with CAØ=1 is considered an odd word address).

Figure 2:
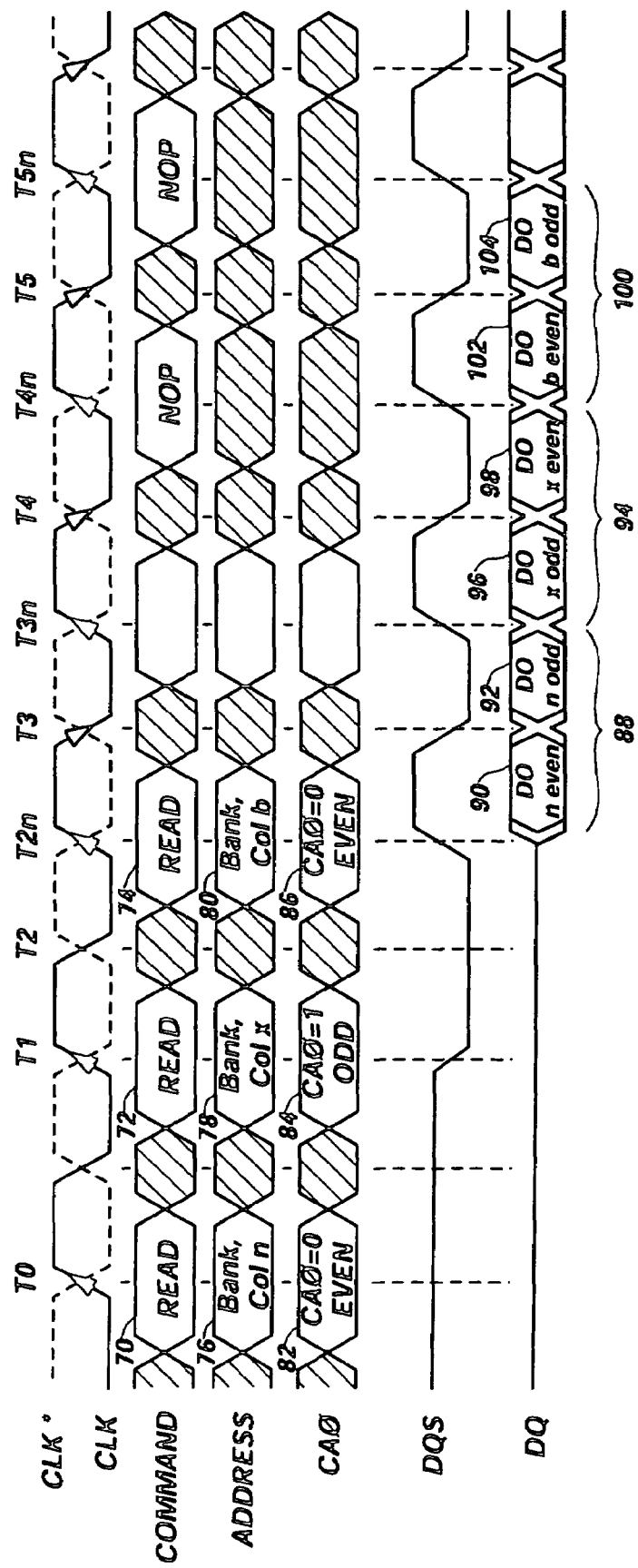
FIG. 2 is a timing diagram illustrating data ordering, in accordance with one embodiment of the present invention.

FIG. 2 is a timing diagram illustrating typical random read operations according to an embodiment of the present invention. Individual read commands 70, 72, 74 are presented to the DDR memory. Each read command 70, 72, 74 includes respective addresses 76, 78, 80 specifying the specific combination of a bank address, a row address, and a column address. Additionally, the least significant bit of the column address, CAØ, 82, 84, 86, respectively, specifies the output ordering of the retrieved multiple data bits. For purposes of explanation, the use of "data bits" and "data words" may be used interchangeably with the use of "data words" implying parallel arrays of memory cells cooperatively forming plural bit words.

As shown in FIG. 2, read command 70 results in an output of data word pair 88 which is ordered according to CAØ 82 with even data word 90 preceding odd data word 92. In a converse ordering, read command 72 specifies CAØ 84 to reverse the output ordering of data word pair 94 such that odd data word 96 precedes even data word 98 when output. Similar to the ordering of read command 70, read command 74 results in an output of data word pair 100 which is ordered according to CAØ 86 with even data word 102 preceding odd data word 104.

Figure 3A:
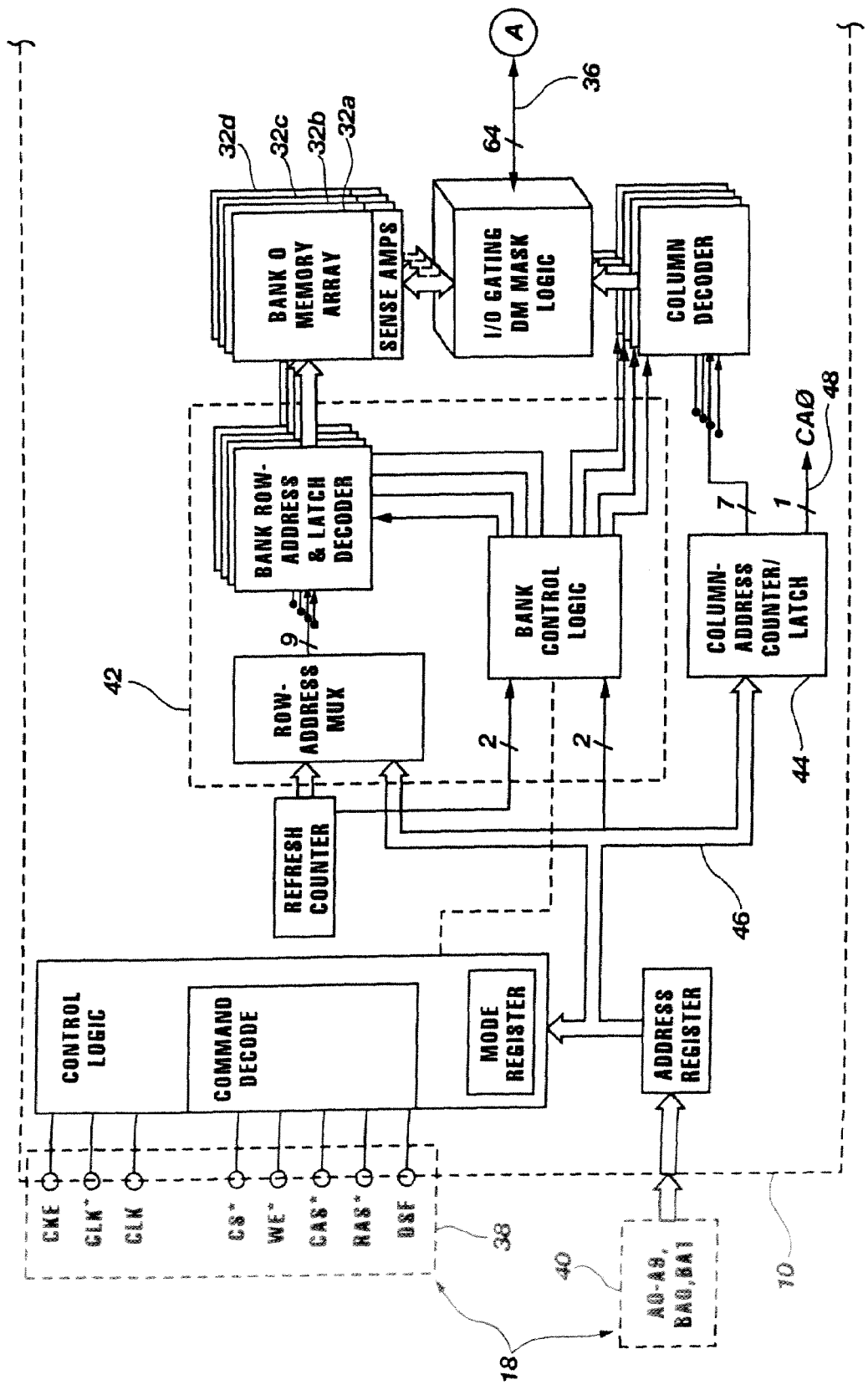
FIGS. 3A-3B are diagrams of a DDR memory according to one embodiment of the present invention.
Figure 3B:
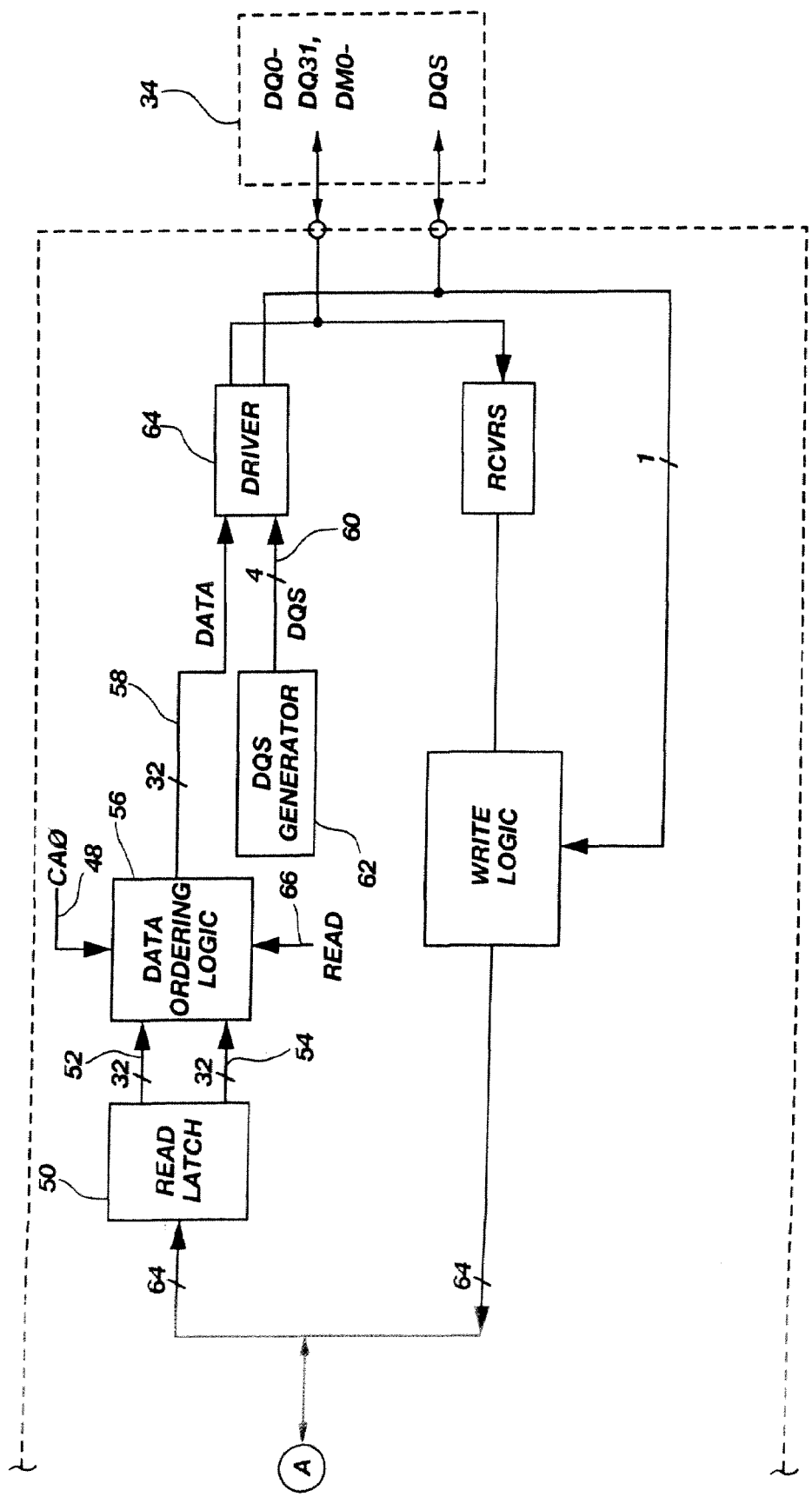

A more detailed diagram of a DDR memory, in accordance with an exemplary embodiment of the present invention, is shown in FIGS. 3A and 3B. DDR memory 10 is illustrated, by way of example, as a 16 megabit (Mb), high-speed Complementary Metal Oxide Semiconductor (CMOS), which, by way of illustration and not limitation, is illustrated as an internally configured quad-bank DRAM with each bank 32a, 32b, 32c and 32d organized as 512 rows by 256 words by 32 bits. The exemplary DDR memory 10 is further illustrated to include an internal, pipelined DDR architecture to achieve high-speed operation. The illustrated DDR memory architecture, by way of example and not limitation, is a 2n prefetch architecture with an output interface for transferring two data words per clock cycle at input/output (I/O) terminals 34 (FIG. 3B). An exemplary read access of DDR memory 10 includes a single 64-bit, 1-clock-cycle data transfer at an internal memory core path 36 and two corresponding 32-bit, one-half-clock-cycle data transfer as seen at output (I/O) terminals 34.

A bidirectional data strobe (DQS), part of the I/O terminals 34, is transferred externally, along with data DQn, for use in data capture at a receiver. DQS is an intermittent strobe transmitted by the DDR memory 10 during read operations and by the memory controller (not shown) during write operations. DQS is edge-aligned with data for read operations and center-aligned with data for write operations. DDR memory 10 operates from a differential clock, CLK and CLK*, which form part of control signals 38 which further form part of interface lines 18. For uniformity in reference, the transitioning of CLK from a low state to a high state is referred to as the positive edge of CLK. Address and control signals of interface lines 18, generally referred to as commands, are registered on each positive edge of CLK with output data registered on both edges, the rising and falling edges, of CLK at output (I/O) terminals 34.

Read accesses to DDR memory 10 may occur according to various commands which cause accessing to start at a selected location and, in the case of a burst mode access, reading continues for a selected number of locations. In an exemplary embodiment, read accesses begin with the registration of an ACTIVE command which is then followed by a READ command. The address bits registered coincident with the ACTIVE command are used to select the bank and row to be accessed (BA0, BA1 which select the bank; A0-A8 which select the row at bank and row pins 40) by way of bank and row logic circuitry 42.

DDR memory 10 is illustrated, by way of example and not limitation, as a pipelined, multibank architecture providing for concurrent operation, thereby providing high effective bandwidth by hiding row precharge and activation time. DDR memory 10 may, in one embodiment, be designed to operate in low-power memory systems and in auto refresh modes as well as other modes such as power saving and power down modes. All inputs of DDR memory 10 may be compatible with the Joint Electronic Device Engineering Council (JEDEC) standard for SSTL-2, as known by those of ordinary skill in the art.

DDR memory 10 further includes an address counter/latch 44 which captures the address information provided externally on lines 46 during a read operation. Column address counter/latch 44 further captures column address bit CAØ signal 48. Referring to FIG. 3B, DDR memory 10 further includes a read latch 50 which receives the 2n odd and even words, which in the present example are 32 bit words, from the respective memory banks 32a, 32b, 32c, 32d. The odd and even word addressing described herein applies to the logical circuitry and not necessarily to the memory array. Furthermore, the term word address defines the complete address (CA7-CAØ) which is a logical address in the memory array and not necessarily a physical address (i.e., the 2n-bit words that are selected according to CAØ are not individually addressable or selectable within memory array 14). Read latch 50 outputs on even data lines 52 the even n-bit word and on odd data lines 54 the n-bit odd data word.

DDR memory 10 further includes data ordering logic 56 which receives the two n-bit even and odd data words and correctly orders the data words for output on data line 58 according to the even and odd data word ordering designator CAØ signal 48. The odd and even data words are thereafter ordered and output on data lines 58 with DQS strobe lines 60 as generated by DQS generator 62. The respective signals are received by a driver 64 which provides DQ outputs DQ0-DQ31 at output (I/O) terminals 34.

Figure 4:
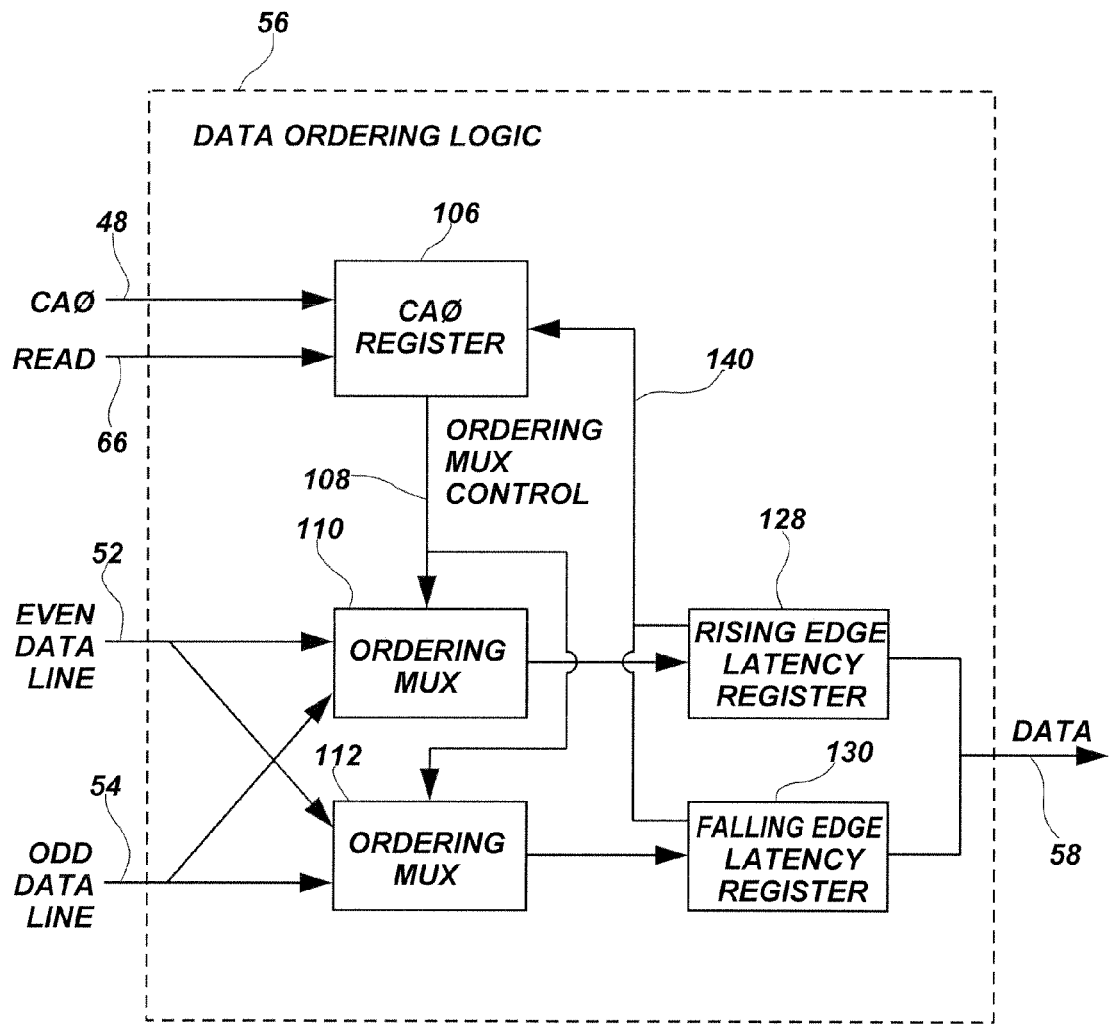
FIG. 4 is a detailed diagram of data ordering logic according to one embodiment of the present invention.

FIG. 4 is a block diagram of data ordering logic 56 for interimly storing the odd and even data words for the specified output ordering according to the even and odd ordering signal CAØ signal 48. FIG. 4 is a detailed block diagram of the data ordering logic 56 according to one embodiment of the present invention. Data ordering logic 56 receives addressing information, specifically data word ordering information, along with the data to be ordered and performs the prescribed ordering of the data words. In the present invention, the data ordering is self-timed with the latching of ordered data which resolves propagation disparities between data path latency and control path latency. In the present embodiment, control of the data ordering is allowed to change only after the preceding ordered data has been latched into the latency register.

By way of example and not limitation, FIG. 4 illustrates one embodiment for accomplishing the above-stated objective. In the exemplary embodiment, data ordering logic 56 includes a means for buffering a multiple data word ordering indicator, namely CAØ signal 48, corresponding to a current valid read signal 66. By way of example and not limitation, a means for buffering a multiple data word ordering indicator is illustrated as a CAØ register 106 which buffers CAØ 48 upon the occurrence of a valid read signal 66 and generates an ordering mux control signal 108 corresponding with the specified ordering of the data word pair presented to the ordering muxes 10, 112. The CAØ register 106 functions as a data word or bit ordering designator register configured to store, in a first-in first-out order, a data word ordering designator from each of the successive read operations designating a simultaneous read of a plurality of data words. The CAØ register 106 is also configured to generate an ordering control or mux control signal 108 according to a first-out one of the data word ordering designator. Additional pipelining registers may also be implemented to buffer correctly ordered data word pairs pending the arrival of a specific clock cycle and the respective edge of the clock cycle.

Figure 5:
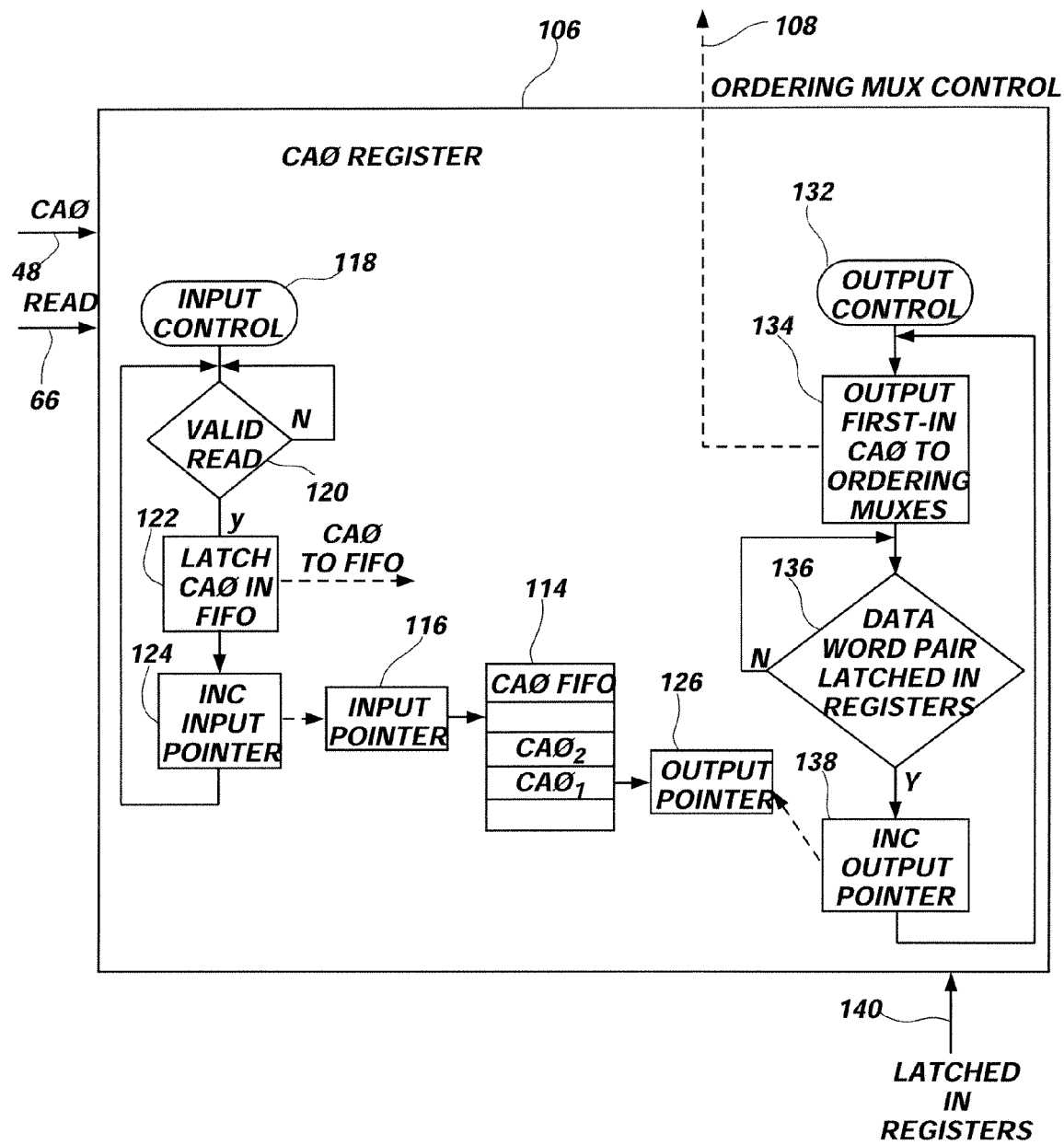
FIG. 5 is an operational diagram illustrating the logical operation within the data ordering logic of a DDR memory according to one embodiment of the present invention.

FIG. 5 is a detailed functional diagram of CAØ register 106, according to an exemplary embodiment of the present invention. While FIG. 5 illustrates the functional operation of CAØ register 106, implementation of logic circuitry from the illustrated functional operation is understood by those of ordinary skill in the art, and is not further described herein. Returning to FIG. 5, CAØ register 106 includes a means for temporarily buffering the multiple data word ordering indicators when received during a valid read command until the corresponding multiple data words are retrieved from the memory array 14 (FIG. 1). The CAØ register 106 then generates the ordering mux control signal 108. By way of example and not limitation, the means for temporarily buffering the multiple data word ordering indicator CAØ signal 48 in one exemplary embodiment implements is a First-In First-Out buffer (FIFO) 114. Those of ordinary skill in the art appreciate that a FIFO may be implemented as a series of shift registers that include an indicator or pointer to the next vacant storage location for storing the currently received CAØ value as well as an indicator or pointer to the oldest stored (first-out) data as well.

In FIG. 5, CAØ FIFO 114 includes an input pointer 116 indicating the next available buffer for temporarily storing the multiple data word ordering indicator, CAØ, while the corresponding read command proceeds to retrieve the corresponding data word pair from the memory array 14 (FIG. 1). Management of input pointer 116 preferably occurs in hardware that includes logic implementing input pointer control 118 which includes monitoring 120 for a valid read command that may include a corresponding multiple data word ordering designator or indicator CAØ signal 48 and latching 122 the corresponding CAØ into a location within CAØ FIFO 114 as indicated by input pointer 116. Input pointer 116 is thereafter incremented 124 to accommodate a subsequent read command.

CAØ FIFO 114 also includes an output pointer 126 identifying the next value of CAØ to be used as the ordering value for ordering multiplexor ("mux") control 108. Referring to FIG. 4, ordering muxes 110, 112 each receive even data line 52 and odd data line 54 and appropriately pass, under the control of ordering mux control signal 108, either the even data line 52 or the odd data line 54 to respective latency registers 128, 130. Ordering mux 10 couples to a rising edge latency register 128 for receiving either even data words or odd data words, as specified by the corresponding CAØs, and temporarily buffers the selected word for outputting on data line 58 on the rising edge of a memory clock. Ordering mux 112 couples to a falling edge latency register 130 for receiving either odd data words or even data words, as specified by the corresponding CAØs and temporarily buffering the selected word for outputting on data line 58 on the falling edge of a memory bus clock.

Management of the output pointer 126 occurs in a self-timed manner, meaning that the ordering mux control signal changes only upon positive feedback when the data word pair has been ordered and latched. Management of output pointer 126 occurs in hardware that includes logic implementing output pointer control 132 which includes outputting 134 the next CAØ from the FIFO as ordering mux control signal 108 to ordering muxes 110, 112 (FIG. 4). Also, output pointer 126 retains the current CAØ value on ordering mux control signal 108 until the even and odd data words are latched 136, as indicated by latch signal 140 (FIG. 4), into registers 128, 130. Thereafter, output pointer 126 is incremented 138.

Figure 6:
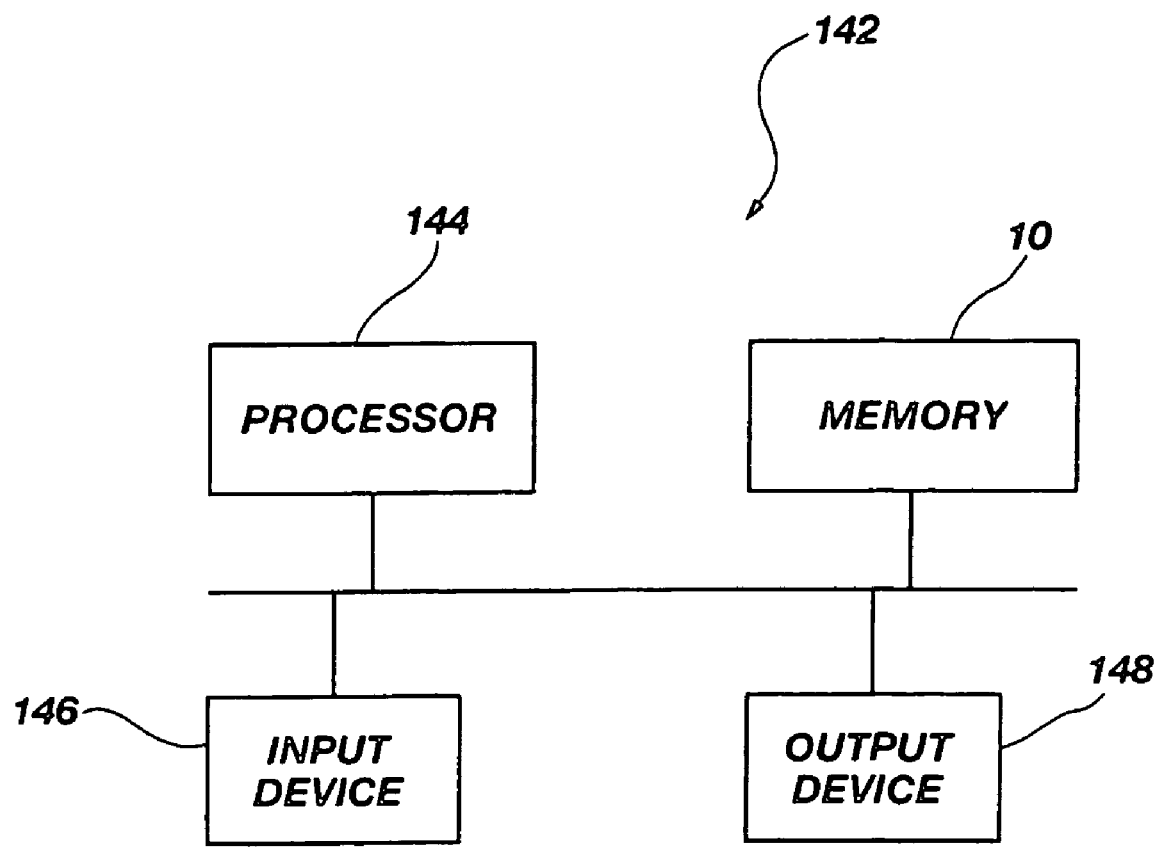
FIG. 6 is a system including a DDR memory according to one embodiment of the present invention.

Referring now to FIG. 6, a diagram of a system 142 in conjunction with which embodiments of the invention may be implemented is shown. System 142 may include a computer, embedded systems or other electronic computational embodiments. System 142 includes a processor 144, memory 10, at least one input device 146 and at least one output device 148 which are operatively coupled to one another.

While the invention may be susceptible to various modifications and alternative forms, specific embodiments have been shown by way of example in the drawings and have been described in detail herein. However, it should be understood that the invention is not intended to be limited to the particular forms disclosed. Rather, the invention includes all modifications, equivalents, and alternatives falling within the spirit and scope of the invention as defined by the following appended claims.

What is claimed is:

1. A method for outputting ordered data, comprising:
   substantially simultaneously retrieving a plurality of even data and odd data corresponding to a respective plurality of addresses;
   storing simultaneously a respective plurality of data word ordering indicators of each of the plurality of retrieved even and odd data in a first-in first-out order; and
   outputting in a single clock cycle each of the even data and the odd data as reordered in an order determined from the respective data word ordering indicators.

2. The method of claim 1, further comprising determining the order of the even data and the odd data from a bit of a single address forming at least one of the data word ordering indicators.

3. The method of claim 2, further comprising configuring data ordering circuitry according to a first-output one of the data word ordering indicator.

4. The method of claim 3, further comprising latching a first-output one of a plurality of even data and odd data corresponding to and ordered according to the first-output one of the data word ordering indicator.

5. The method of claim 3, wherein configuring data ordering circuitry comprises:
   operably coupling a multiplexor to each of the plurality of the even data and the odd data; and
   configuring the multiplexor according to the first-output one of the even data word ordering indicator.

6. The method of claim 4, reconfiguring the data ordering circuitry according to a next-output data word ordering indicator upon latching of the first-output one of the plurality of the even data and the odd data.

7. The method of claim 4, wherein latching a first-output one of the plurality of even data and odd data further comprises latching the plurality of the even data and the odd data into a corresponding plurality of latches for outputting on a corresponding plurality of clock phases.

8. The method of claim 7, wherein latching the plurality of the even data and the odd data comprises latching two data retrieved from a Dual Data Rate (DDR) memory into a rising edge register and a falling edge register for outputting on corresponding clock phases.

9. The method of claim 2, wherein storing further comprises providing a First-In First-Out buffer (FIFO) for storing the data word ordering indicator for each of the successive read operations.

10. The method of claim 9, wherein reconfiguring further comprises reading the next-output data word ordering indicator from the FIFO.

11. The method of claim 2, wherein storing a data word ordering indicator further comprises identifying an indicator in each of the successive read operations as the data word ordering indicator.

12. A memory device, comprising:
    a memory array configured to substantially simultaneously retrieve a plurality of even data and odd data words corresponding to a respective plurality of addresses; and
    a data ordering circuit coupled to the memory array for receiving the plurality of even data and odd data words, the data ordering circuit including:
    a data word ordering designator register and ordering circuitry configured to store simultaneously a respective plurality of data word ordering indicators of each of the plurality of retrieved even and odd data in a first-in first-out order and
    a plurality of even and odd registers corresponding to the plurality of data words coupled to the data word ordering circuitry for outputting in a single clock cycle each of the even data and the odd data words as reordered in an order determined from the respective data word ordering indicators.

13. The memory device of claim 12, wherein ordering circuitry comprises a multiplexor for each of the plurality of even data and odd data words, each multiplexor configured to be responsive to an ordering control signal.

14. The memory device of claim 12, wherein the plurality of registers comprises a first register for outputting one of the plurality of even data and odd data words on a first phase of a clock and a second register for outputting another one of the plurality of even data and odd data words on a second phase of the clock.

15. The memory device of claim 14, wherein the first register and the second register are configured for outputting one of the plurality of even data and odd data words on a rising edge of the clock and another one of the plurality of even data and odd data words on a failing edge of the clock.

16. The memory device of claim 12, wherein the memory array includes even and odd memory banks from which the plurality of even data and odd data words is read.

* * * * *

UNITED STATES PATENT AND TRADEMARK OFFICE
CERTIFICATE OF CORRECTION

PATENT NO. : 7,464,231 B2
APPLICATION NO. : 11/519698
DATED : December 9, 2008
INVENTOR(S) : Raad It is certified that error appears in the above-identified patent and that said Letters Patent is hereby corrected as shown below:

Title page, Item (56), under "U.S. Patent Documents", in column 2, line 4, delete "365/235" and insert -- 365/233 --, therefor.

In column 8, line 34, in Claim 12, after "plurality of" delete "even and odd".

In column 8, line 35, in Claim 12, after "plurality of" insert -- even data and odd --.

In column 8, line 40, in Claim 13, after "wherein" insert -- the --.

In column 8, line 54, in Claim 15, delete "failing" and insert -- falling --, therefor.

Signed and Sealed this

Tenth Day of February, 2009

JOHN DOLL
*Acting Director of the United States Patent and Trademark Office*